United States Patent
Wu et al.

(10) Patent No.: US 11,549,501 B2
(45) Date of Patent: *Jan. 10, 2023

(54) FLUID DRIVING SYSTEM

(71) Applicant: Koge Micro Tech Co., Ltd., New Taipei (TW)

(72) Inventors: Chung-Han Wu, New Taipei (TW); Jun-Yan Huang, New Taipei (TW); Hsin-Cheng Wang, New Taipei (TW)

(73) Assignee: KOGE MICRO TECH CO., LTD., New Taipei (TW)

( * ) Notice: Subject to any disclaimer, the term of this patent is extended or adjusted under 35 U.S.C. 154(b) by 768 days.

This patent is subject to a terminal disclaimer.

(21) Appl. No.: 16/538,847

(22) Filed: Aug. 13, 2019

(65) Prior Publication Data
US 2020/0052187 A1   Feb. 13, 2020

(30) Foreign Application Priority Data

Aug. 13, 2018 (TW) ................. 107128144

(51) Int. Cl.
*F04B 43/04*   (2006.01)
*H01L 41/09*   (2006.01)

(52) U.S. Cl.
CPC ........ *F04B 43/046* (2013.01); *H01L 41/0973* (2013.01)

(58) Field of Classification Search
CPC ...... F04B 43/04; F04B 43/043; F04B 43/046; H01L 41/042; H01L 41/0475; H01L 41/047; H01L 41/083; H01L 41/053; H01L 41/09; H01L 41/0973; F16K 99/0048

See application file for complete search history.

(56) References Cited

U.S. PATENT DOCUMENTS

| 4,417,170 A | 11/1983 | Benincasa |
| 2004/0000843 A1 | 1/2004 | East |

(Continued)

FOREIGN PATENT DOCUMENTS

| CN | 102979705 | 3/2013 |
| CN | 105579234 | 5/2016 |

(Continued)

*Primary Examiner* — Charles G Freay
*Assistant Examiner* — Chirag Jariwala
(74) *Attorney, Agent, or Firm* — Juan Carlos A. Marquez; Marquez IP Law Office, PLLC

(57) ABSTRACT

A fluid driving system includes a vibration unit, a piezoelectric element, a signal transmission layer, a plane unit, and a protrusion. The piezoelectric element includes a first electrode and a second electrode electrically isolated from each other. The signal transmission layer includes a first conductive zone and a second conductive zone. The first electrode of the piezoelectric element is electrically connected to the first conductive zone of the signal transmission layer, and the second electrode of the piezoelectric element is electrically connected to the second conductive zone of the signal transmission layer. The plane unit has at least one hole. The piezoelectric element, the signal transmission layer, and the plane unit are located at one side of the vibration unit. The protrusion is located between the vibration unit and the plane unit, and the protrusion corresponds to and protrudes toward the at least one hole.

16 Claims, 14 Drawing Sheets

(56) References Cited

U.S. PATENT DOCUMENTS

| | | | | |
|---|---|---|---|---|
| 2013/0058819 | A1* | 3/2013 | Kodama | F04B 43/043 |
| | | | | 417/479 |
| 2016/0107194 | A1* | 4/2016 | Panchawagh | G10K 11/346 |
| | | | | 310/317 |
| 2017/0219121 | A1* | 8/2017 | Chen | F16K 99/0048 |
| 2017/0297335 | A1* | 10/2017 | Takahashi | H01L 41/0973 |
| 2019/0077151 | A1* | 3/2019 | Hirai | B41J 2/161 |

FOREIGN PATENT DOCUMENTS

| | | |
|---|---|---|
| JP | 2009097367 | 5/2009 |
| JP | 2010263061 | 11/2010 |
| TW | M570536 | 11/2018 |

* cited by examiner

FLUID DRIVING SYSTEM

CROSS-REFERENCE TO RELATED APPLICATION

This application claims the priority benefit of Taiwan application serial no. 107128144, filed on Aug. 13, 2018. The entirety of the above-mentioned patent application is hereby incorporated by reference herein and made a part of this specification.

BACKGROUND

Technical Field

The disclosure relates to a fluid driving system, and more particularly to a fluid driving system whose signal transmission layer electrically connected to a piezoelectric element can be better protected.

Description of Related Art

A piezoelectric pump is a new type of fluid driver, which does not require any additional driving motor and can deform a piezoelectric vibrator only by an inverse piezoelectric effect of piezoelectric ceramics, and fluid output can be realized due to the volume change of the pump chamber resulting from said deformation, or fluids can be transported through vibration of the piezoelectric vibrator. Therefore, piezoelectric pumps have gradually replaced traditional pumps and are widely used in electronics, biomedical, aerospace, automotive, and petrochemical industries.

When the piezoelectric element is bent in a positive direction, the volume of the chamber of the pump body (hereinafter referred to as the pump chamber) is increased, so that the pressure in the pump chamber is reduced to allow fluid to flow into the pump chamber from the inlet. On the other hand, when the piezoelectric element is bent in a reverse direction, the volume of the pump chamber is reduced, so that the pressure in the pump chamber is increased, and that the fluid in the pump chamber is squeezed and discharged from the outlet. At present, the circuit structure used to supply electricity to the piezoelectric element is often a multi-layer structure and is located outside the pump body; thus, the overall volume is large, and the structure may be easily damaged.

SUMMARY

The disclosure provides a fluid driving system whose signal transmission layer electrically connected to a piezoelectric element can be better protected.

In an embodiment of the disclosure, a fluid driving system includes a vibration unit, a piezoelectric element, a signal transmission layer, a plane unit, and a protrusion. The piezoelectric element includes a first electrode and a second electrode electrically isolated from each other. The signal transmission layer includes a first conductive zone and a second conductive zone. The first electrode of the piezoelectric element is electrically connected to the first conductive zone of the signal transmission layer, and the second electrode of the piezoelectric element is electrically connected to the second conductive zone of the signal transmission layer. The plane unit has at least one hole. The piezoelectric element, the signal transmission layer, and the plane unit are located at one side of the vibration unit. The protrusion is located between the vibration unit and the plane unit, and the protrusion corresponds to and protrudes toward the at least one hole.

According to an embodiment of the disclosure, the piezoelectric element includes a through hole, and the protrusion passes through the through hole and is fixed to the vibration unit.

According to an embodiment of the disclosure, the protrusion is surrounded by the piezoelectric element.

According to an embodiment of the disclosure, the vibration unit, the piezoelectric element, the signal transmission layer, and the plane unit are sequentially stacked together.

According to an embodiment of the disclosure, the piezoelectric element has a first surface and a second surface opposite to each other, the first electrode and the second electrode are respectively located on the first surface and the second surface, the first surface of the piezoelectric element faces the vibration unit, the vibration unit is a conductor, and the first electrode of the piezoelectric element is electrically connected to the first conductive zone of the signal transmission layer through the vibration unit.

According to an embodiment of the disclosure, the fluid driving system further includes a frame, the vibration unit includes a first central zone, a first peripheral zone, and a plurality of first connection zones connected to the first central zone and the first peripheral zone, the protrusion and the piezoelectric element are fixed to the first central zone of the vibration unit, and the frame is fixed to the first peripheral zone of the vibration unit.

According to an embodiment of the disclosure, a surface of the frame facing the plane unit is coplanar with a surface of the piezoelectric element facing the plane unit.

According to an embodiment of the disclosure, the vibration unit further includes a first central zone, a first peripheral zone, and a plurality of first connection zones connected to the first central zone and the first peripheral zone, and a surface of the first peripheral zone facing the plane unit is coplanar with a surface of the piezoelectric element facing the plane unit.

According to an embodiment of the disclosure, the fluid driving system further includes a transmission unit located between the piezoelectric element and the plane unit, the transmission unit includes a second central zone corresponding to the piezoelectric element and a second peripheral zone located outside the second central zone, the first conductive zone is formed in the second central zone of the transmission unit, and the second conductive zone is formed in the second peripheral zone of the transmission unit.

According to an embodiment of the disclosure, the fluid driving system further includes a transmission unit located between the piezoelectric element and the plane unit, the transmission unit includes a second central zone corresponding to the piezoelectric element and a second peripheral zone located outside the second central zone, the first conductive zone is formed in the second central peripheral zone of the transmission unit, and the second conductive zone is formed in—on the second peripheral central zone of the transmission unit.

According to an embodiment of the disclosure, the fluid driving system further includes a transmission unit located between the piezoelectric element and the plane unit, and the support member is arranged between the transmission unit and the plane unit.

According to an embodiment of the disclosure, the support member and the transmission unit are integrally formed.

According to an embodiment of the disclosure, the vibration unit, the signal transmission layer, the piezoelectric element, and the plane unit are sequentially stacked together.

According to an embodiment of the disclosure, the fluid driving system further includes a transmission unit, the first conductive zone and the second conductive zone are formed on the transmission unit, the transmission unit is located between vibration unit and the piezoelectric element, the piezoelectric element includes a first surface facing the transmission unit, and the first electrode and the second electrode are located on the first surface of the piezoelectric element.

According to an embodiment of the disclosure, the transmission unit is a flexible printed circuit board (FPCB).

According to an embodiment of the disclosure, the vibration unit and the protrusion are integrally formed.

In view of the above, the piezoelectric element, the signal transmission layer, and the plane unit of the fluid driving system provided in the disclosure are respectively located on the same side of the vibration unit. The signal transmission layer configured to be electrically connected to the first electrode and the second electrode of the piezoelectric element is located between the vibration unit and the plane unit; that is, the signal transmission layer is formed inside the fluid driving system and can be better protected. Besides, generally speaking, the central zone of the fluid driving system (i.e., a location of each layer corresponding to the hole of the plane unit which may be the valve plate) can be said to be the primary functional zone of the fluid driving system. In the fluid driving system provided in one or more embodiments of the disclosure, the protrusion is arranged between the vibration unit and the plane unit, and the protrusion corresponds to and protrudes toward the hole. As such, the movable components at the central location of the fluid driving system provided herein can only be the vibration unit, the protrusion, and the plane unit. That is, the number of components at the central location of the fluid driving system is small, which ensures that the fluid driving system has a relatively small tolerance and good precision.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
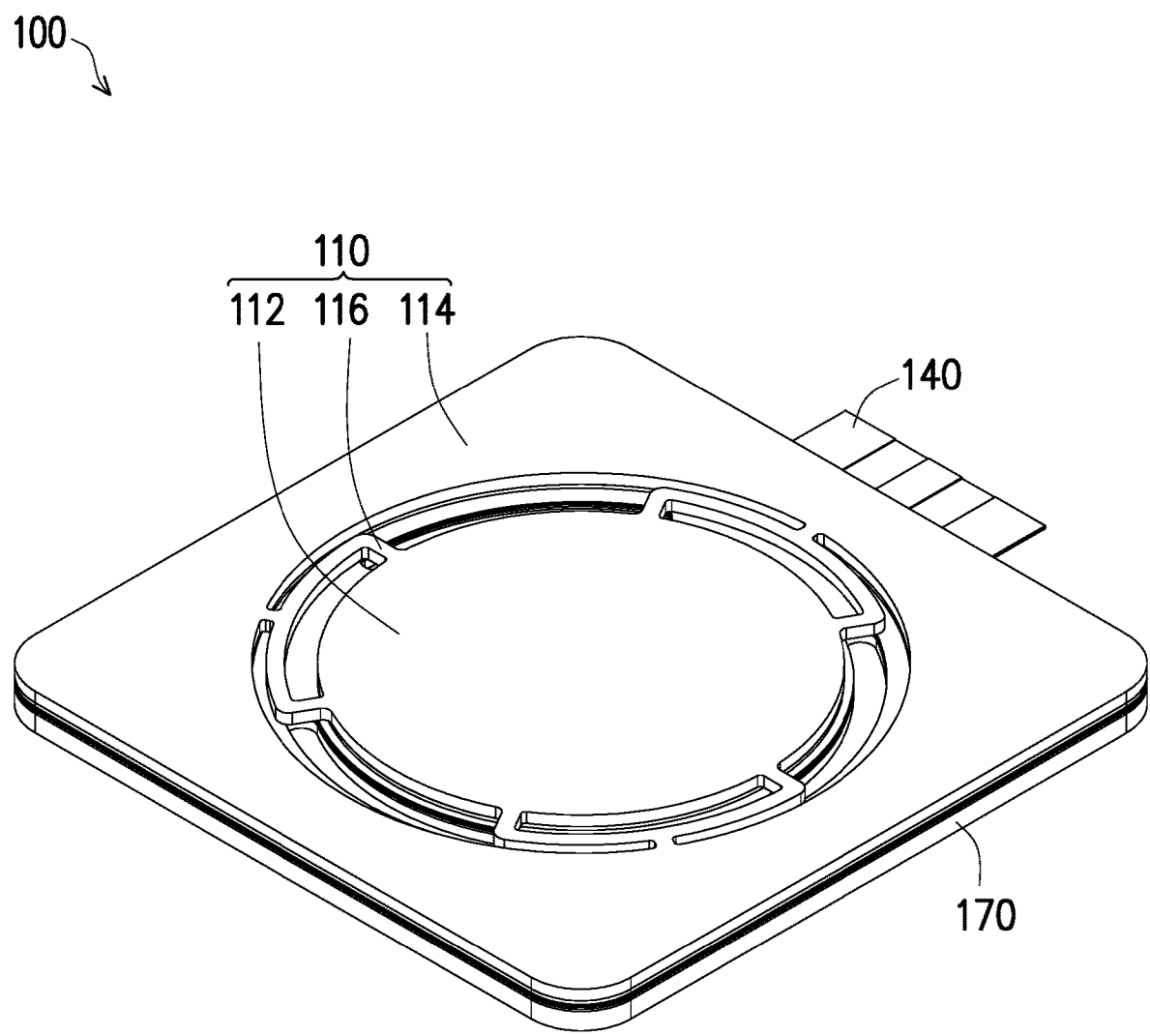
FIG. 1 is a schematic view of a fluid driving system according to a first embodiment of the disclosure.
Figure 2:
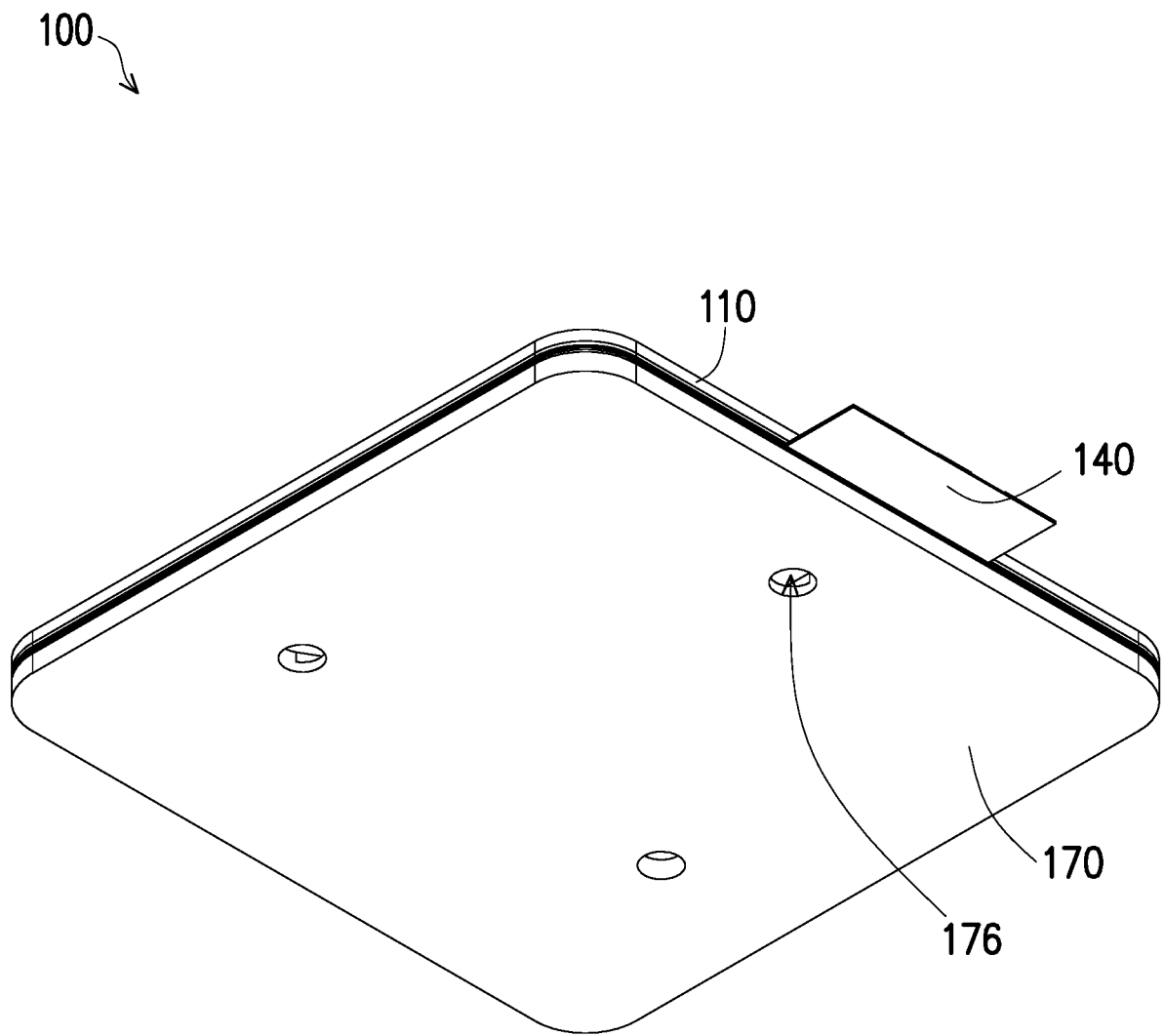
FIG. 2 is a schematic view illustrating the fluid driving system in FIG. 1 at another view angle.
Figure 3:
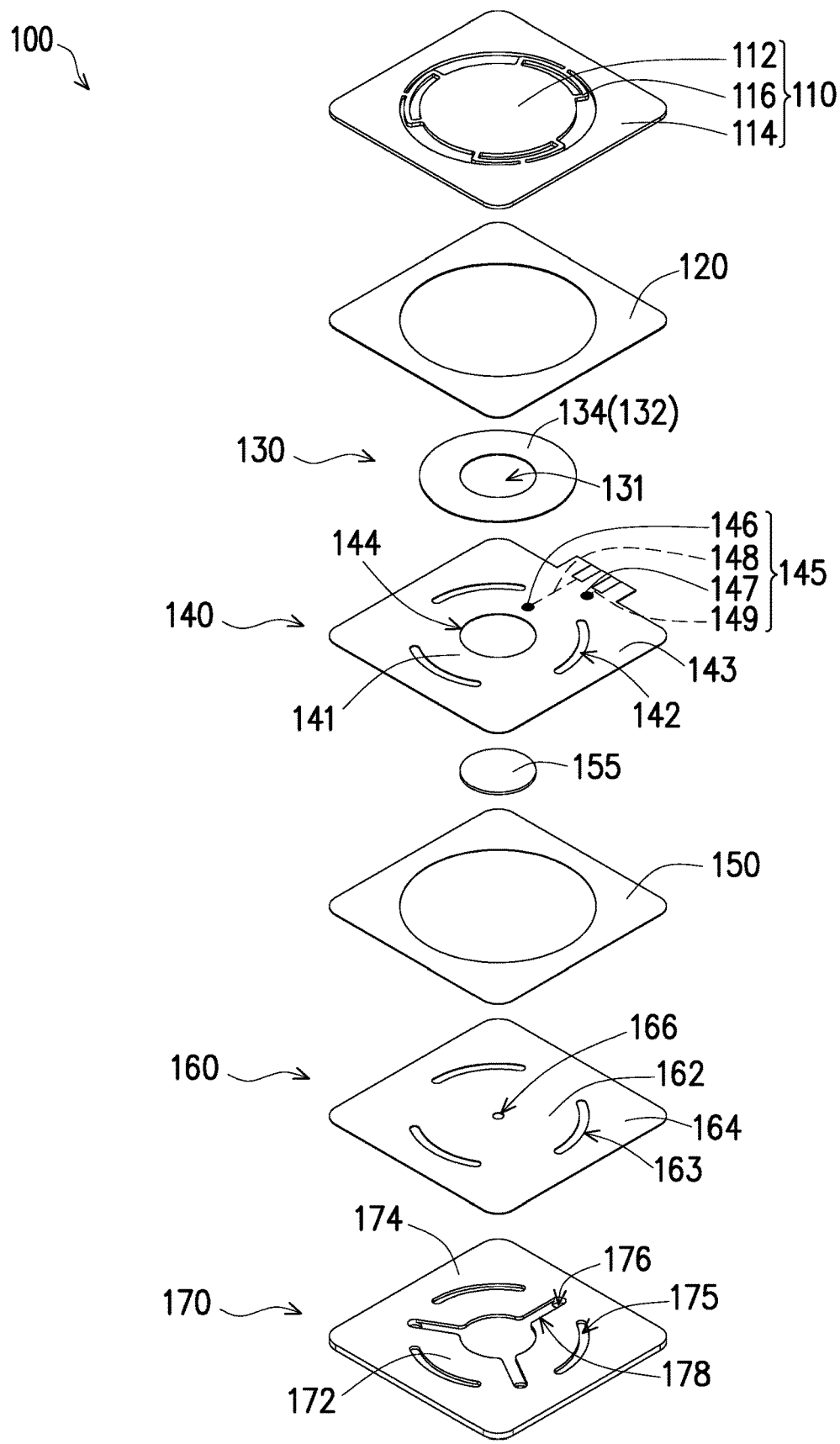
FIG. 3 is a schematic exploded view illustrating the fluid driving system in FIG. 1.
Figure 4:
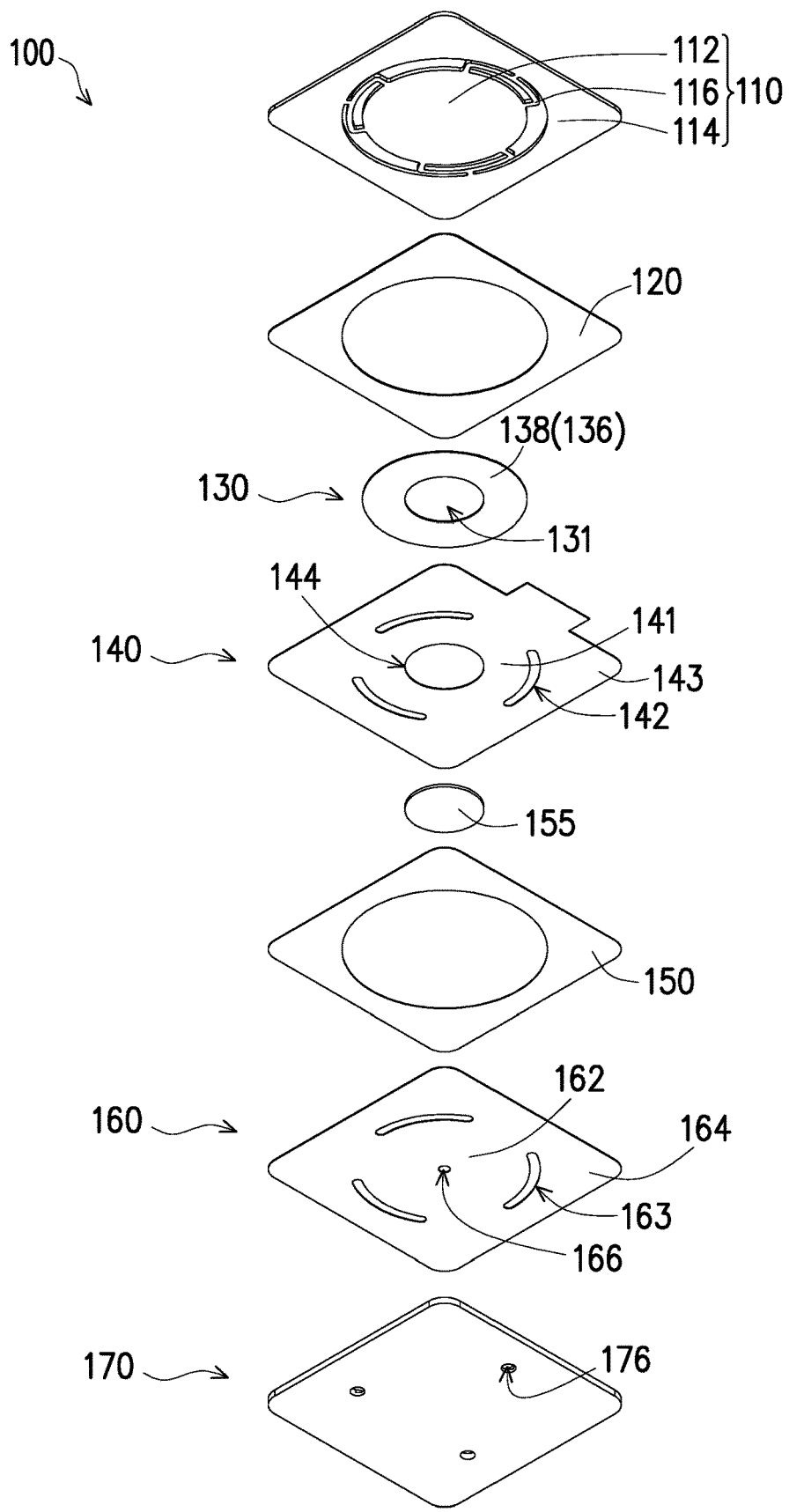
FIG. 4 is a schematic view of FIG. 3 at another view angle.
Figure 5A:
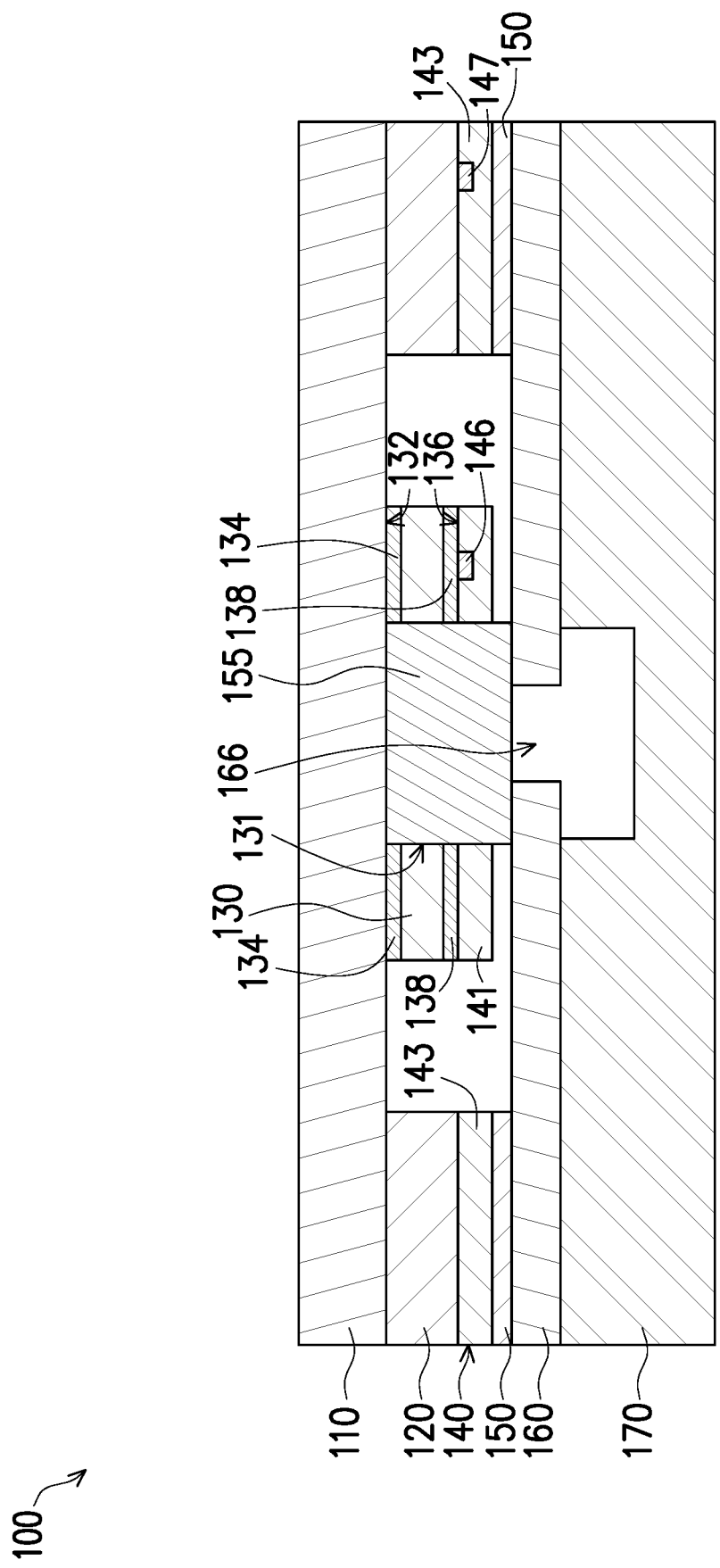
FIG. 5A is a schematic cross-sectional view illustrating the fluid driving system depicted in FIG. 1.
Figure 5B:
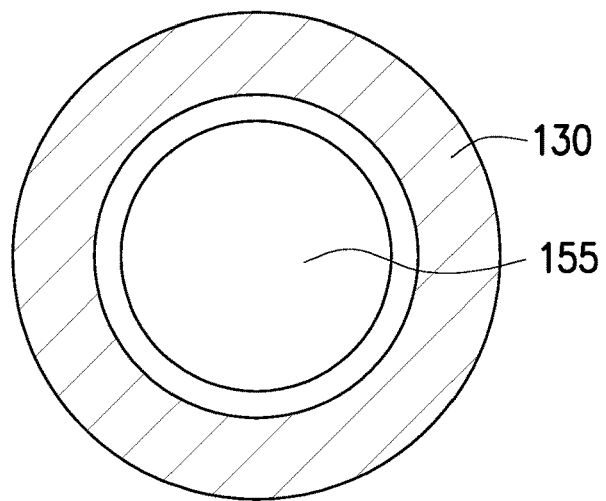
FIG. 5B is a schematic top view illustrating the protrusion and the piezoelectric element of the fluid driving system depicted in FIG. 1.

FIG. 1 is a schematic view of a fluid driving system according to a first embodiment of the disclosure. FIG. 2 is a schematic view illustrating the fluid driving system in FIG. 1 at another view angle. FIG. 3 is a schematic exploded view illustrating the fluid driving system in FIG. 1. FIG. 4 is a schematic view of FIG. 3 at another view angle. FIG. 5A is a schematic cross-sectional view illustrating the fluid driving system depicted in FIG. 1. FIG. 5B is a schematic top view illustrating the protrusion and the piezoelectric element of the fluid driving system depicted in FIG. 1. With reference to FIG. 1 to FIG. 5B, the fluid driving system 100 provided in the embodiment includes a vibration unit 110, a piezoelectric element 130, a signal transmission layer 145, a plane unit 160, and a protrusion 155. The fluid driving system 100 will be described in detail below.

With reference to FIG. 3 and FIG. 4, in the present embodiment, the vibration unit 110 includes a first central zone 112, a first peripheral zone 114, and a plurality of first connection zones 116 connected to the first central zone 112 and the first peripheral zone 114. The first central zone 112 is movable relative to the first peripheral zone 114. In addition, in the embodiment, the material of the vibration unit 110 may include a metal or an alloy and has a flexible property, but the material of the vibration unit 110 is not limited thereto. Certainly, in other embodiments, the vibration unit 110 may be partially conductive, e.g., a portion of the first central zone 112, the first peripheral zone 114, and the first connection zones 116.

In the present embodiment, the piezoelectric element 130 has a first surface 132 and a second surface 136 opposite to each other and includes a first electrode 134 (shown in FIG. 3) and a second electrode 138 (shown in FIG. 4) that are electrically isolated from each other. The first electrode 134 and the second electrode 138 are respectively located on the first surface 132 and the second surface 136. One of the first electrode 134 and the second electrode 138 is a positive electrode, and the other is a negative electrode.

In the present embodiment, the first surface 132 of the piezoelectric element 130 faces the vibration unit 110. Particularly, in the present embodiment, the piezoelectric element 130 is fixed to the first central zone 112 of the vibration unit 110. When electricity is supplied to the piezoelectric element 130, the piezoelectric element 130 moves and thus can drive the first central zone 112 of the vibration unit 110 to move. In addition, in the embodiment, the shape of the piezoelectric element 130 may be a sheet shape or an arbitrary geometric shape, and the contour of the piezoelectric element 130 may be an arc, a polygon, a rectangle, etc. The shape of the piezoelectric element 130 is not limited in the disclosure.

In the present embodiment, the signal transmission layer 145 includes a first transmission zone 149 and a second transmission zone 148 that are electrically isolated. More specifically, in the present embodiment, the fluid driving system 100 further includes a transmission unit 140 located between the piezoelectric element 130 and the plane unit 160. The transmission unit 140 is a flexible printed circuit board (FPCB). The transmission unit 140 includes a second central zone 141 surrounded by a plurality of slots 142 and corresponding to the piezoelectric element 130 and a second peripheral zone 143 located outside the second central zone 141. A first transmission zone 149 and a second transmission zone 148 are formed on the transmission unit 140, respectively. In particular, the second transmission zone 148 is formed in the second central zone 141 of the transmission unit 140, and the first transmission zone 149 is formed in the second peripheral zone 143 of the transmission unit 140. The first transmission zone 149 and the second transmission zone 148 on the transmission unit 140 are electrically isolated and insulated from each other but are not electrically connected to each other.

In the present embodiment, the first electrode 134 of the piezoelectric element 130 is electrically connected to the first transmission zone 149 of the signal transmission layer 145, and the second electrode 138 of the piezoelectric element 130 is electrically connected to the second transmission zone 148 of the signal transmission layer 145. As shown in FIG. 4 and FIG. 5, in the present embodiment, the second transmission zone 148 is electrically connected to the second electrode 138 of the piezoelectric element 130 through a second conductive zone 146. Besides, as shown in FIG. 3 and FIG. 5, in the present embodiment, the vibration unit 110 is a conductor, and the first electrode 134 of the piezoelectric element 130 is electrically connected to the first transmission zone 149 of the signal transmission layer 145 through the vibration unit 110.

More specifically, as shown in FIG. 3, in the present embodiment, the fluid driving system 100 further includes a frame 120 located between the first peripheral zone 114 of the vibration unit 110 and the second peripheral zone 143 of the transmission unit 140. In the present embodiment, the first electrode 134 of the piezoelectric element 130 is in contact with the first central zone 112 of the vibration unit 110 having conductivity, the frame 120 is fixed to the first peripheral zone 114 of the vibration unit 110, the first conductive zone 147 of the transmission unit 140 is located at the second peripheral zone 143 of the transmission unit 140, and the first conductive zone 147 is connected to the first transmission zone 149. The frame 120 is made of a metallic material, for instance.

Said configuration allows a conductive path to be formed among the first electrode 134 of the piezoelectric element 130, the first central zone 112 of the vibration unit 110, the first connection zones 116, the first peripheral zone 114, the frame 120, the first conductive zone 147, and the first transmission zone 149. Hence, the first electrode 134 of the piezoelectric element 130 can be electrically connected to the first transmission zone 149 of the transmission unit 140.

Certainly, in other embodiments, the first transmission zone 149 and the second transmission zone 148 may also be two general-purpose wires or may be directly connected to the first electrode 134 and the second electrode 138 of the piezoelectric element 130, the first transmission zone 149 and the second transmission zone 148 are not necessarily formed on the transmission unit 140 nor formed at the same layer, and the first electrode 134 of the piezoelectric element 130 and the first transmission zone 149 need not be electrically connected by the vibration unit 110 and the frame 120. As long as the first transmission zone 149 and the second transmission zone 148 are electrically connected to the first electrode 134 and the second electrode 138 of the piezoelectric element 130, said structure should not be construed as a limitation in the disclosure.

Additionally, in the present embodiment, the piezoelectric element 130 has a through hole 131. The transmission unit 140 has an opening 144 corresponding to the through hole 131. The protrusion 155 passes through the through hole 131 of the piezoelectric element 130 and the opening 144 of the transmission unit 140 and is fixed to the first central zone 112 of the vibration unit 110. In the present embodiment, the protrusion 155 is surrounded by the piezoelectric element 130 and the transmission unit 140.

Generally speaking, the central zone of the fluid driving system (i.e., a location of each movable layer corresponding to the hole of the plane unit which may be the valve plate) can be said to be the primary functional zone of the fluid driving system. As shown in FIG. 5A, in the fluid driving system 100 provided in one or more embodiments of the disclosure, the protrusion 155 is arranged between the vibration unit 110 and the plane unit 160, and the protrusion 155 corresponds to and protrudes toward the hole 166. Thereby, the movable components at the central location of the fluid driving system 100 can only be the vibration unit 110, the protrusion 155, and the plane unit 160. Hence, in the present embodiment, the number of the movable components at the central location of the fluid driving system 100 is small, which ensures that the fluid driving system 100 has a relatively small tolerance at its primary function zone and that the fluid driving system 100 can good precision.

As shown in FIG. 3, in the present embodiment, the plane unit 160 is a valve plate, but the form of the plane unit 160 is not limited thereto. The plane unit 160 includes three arc-shaped slots 163 that surround a circular fourth central zone 162 and distinguish a fourth peripheral zone 164 outside the fourth central zone 162. The plane unit 160 further includes a hole 166 formed in the fourth central zone 162. According to the present embodiment, the location of the fourth central zone 162 corresponds to the location of the piezoelectric element 130. In other embodiments, the number and the shape of the slots 163 of the plane unit 160 should not be construed as limitations. Besides, the material of the plane unit 160 may include metal or a non-conductive material, but the material of the plane unit 160 should not be limited to the material provided herein.

In addition, as shown in FIG. 3, in the present embodiment, the fluid driving system 100 further includes a fluid guiding member 170, and the plane unit 160 is located between the piezoelectric element 130 and the fluid guiding member 170. In this embodiment, the fluid guiding member 170 includes a fifth central zone 172 surrounded by a plurality of grooves 175 and corresponding to the piezoelectric element 130, a fifth peripheral zone 174 located outside the fifth central zone 172, three through holes 176 penetrating the fluid guiding member 170, and three flow paths 178 respectively communicating with the three through holes 176. Certainly, the number of the through holes 176 and the flow paths 178 of the fluid guiding member 170 are not limited thereto.

In the present embodiment, the fifth peripheral zone 174 of the fluid guiding member 170 is attached to the fourth peripheral zone 164 of the plane unit 160, and the fourth central zone 162 of the plane unit 160 is movable relative to the fourth peripheral zone 164. Besides, in this embodiment, the material of the fluid guiding member 170 may include metal or an alloy, which should however not be construed as a limitation in the disclosure.

In the present embodiment, note that the piezoelectric element 130, the signal transmission layer 145, and the plane unit 160 are located at the same side of the vibration unit 110 and are sequentially stacked together. That is, in the present embodiment, the piezoelectric element 130 and the signal transmission layer 145 are located between the vibration unit 110 and the plane unit 160. Since the signal transmission layer 145 is mainly formed within the fluid driving system 100, the signal transmission layer 145 of the fluid driving system 100 provided in the present embodiment can be better protected.

Besides, in the present embodiment, it can be observed from FIG. 5A that a surface of the frame 120 facing the plane unit 160 is coplanar with a surface of the piezoelectric element 130 facing the plane unit 160. The lower surface of the frame 120 is aligned to the lower surface of the piezoelectric element 130; therefore, during the assembling process, the transmission unit 140 can be adhered to the lower surface of the frame 120 and the lower surface of the piezoelectric element 130 at one time rather than at several times. As such, the assembling process is relatively convenient, and the flatness of the transmission unit 140 can be guaranteed.

Additionally, as shown in FIG. 5A, the fluid driving system 100 provided in the present embodiment further includes a support member 150 disposed between the first peripheral zone 114 of the vibration unit 110 and the fourth peripheral zone 164 of the plane unit 160. More specifically, in the present embodiment, the support member 150 is fixed between the second peripheral zone 143 of the transmission unit 140 and the fourth peripheral zone 164 of the plane unit 160. In the present embodiment, the thickness of the protrusion 155 is substantially the same as the sum of the thickness of the frame 120, the thickness of the transmission unit 140, and the thickness of the support member 150. That is, a surface of the support member 150 facing the plane unit 160 is coplanar with a surface of the protrusion 155 facing the plane unit 160.

As such, after the fluid driving system 100 is completely assembled, the protrusion 155 can push against a portion of the plane unit 160 near the hole 166, so as to ensure that at a certain moment of actuation (e.g., at the time shown in FIG. 5), the protrusion 155 pushes against the hole 166, such that fluid (not shown) does not pass through the hole 166.

In the fluid driving system 100 provided in the present embodiment, note that the signal transmission layer 145 electrically connected to the piezoelectric element 130 is disposed on one single transmission unit 140 located between the vibration unit 110 and the plane unit 160. Since the signal transmission layer 145 is formed on one single transmission unit 140, the overall thickness of the fluid driving system 100 provided in the present embodiment is smaller than that of the conventional fluid driving system having a plurality of signal transmission layers, and the fluid driving system 100 provided in the present embodiment can be easily assembled. Besides, the transmission unit 140 is mainly located within the fluid driving system 100 and thus provides better protection for the signal transmission layer 145.

As illustrated in FIG. 5B, in the present embodiment, the piezoelectric element 130 has a ring shape, so that the protrusion 155 continues to be surrounded by the piezoelectric element 130. However, the shape and the number of the piezoelectric element 130 as well as the arrangement relationship between the piezoelectric element 130 and the protrusion 155 should not be construed as limitations in the disclosure.

Figure 5C:
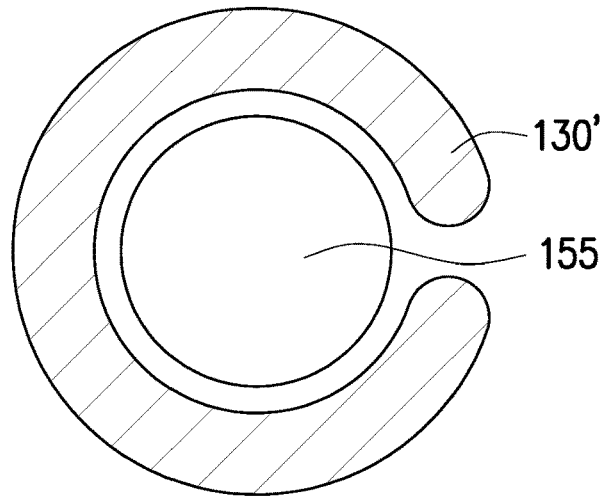
FIG. 5C and FIG. 5D are schematic top views respectively illustrating the protrusion and the piezoelectric element according to several embodiments of the disclosure.
Figure 5D:
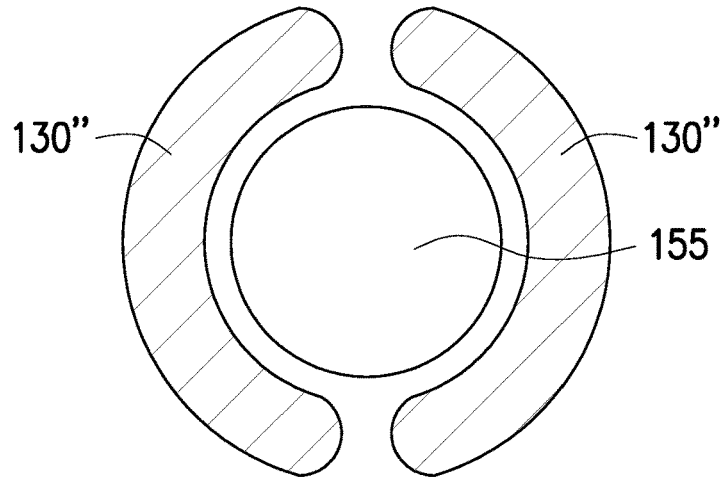

FIG. 5C and FIG. 5D are schematic top views respectively illustrating the protrusion and the piezoelectric element according to several embodiments of the disclosure. With reference to FIG. 5C, in the present embodiment, the piezoelectric element 130' is shaped as a letter C and has an opening. The protrusion 155 is located in the piezoelectric element 130' and is surrounded by the piezoelectric element 130' in a non-continuous manner. With reference to FIG. 5D, in the present embodiment, the fluid driving system can have two piezoelectric elements 130'', each of which has an arc shape. The protrusion 155 is located in the two piezoelectric elements 130'' and is surrounded by the piezoelectric elements 130' in a non-continuous manner.

Other types of fluid driving systems 100a, 100b, 100c, and 100d will be described below. The same or similar elements provided in the following embodiment and the previous embodiment will be denoted by the same or similar reference numerals and will not be described again, but the main differences between these embodiments will be explained below.

Figure 6:
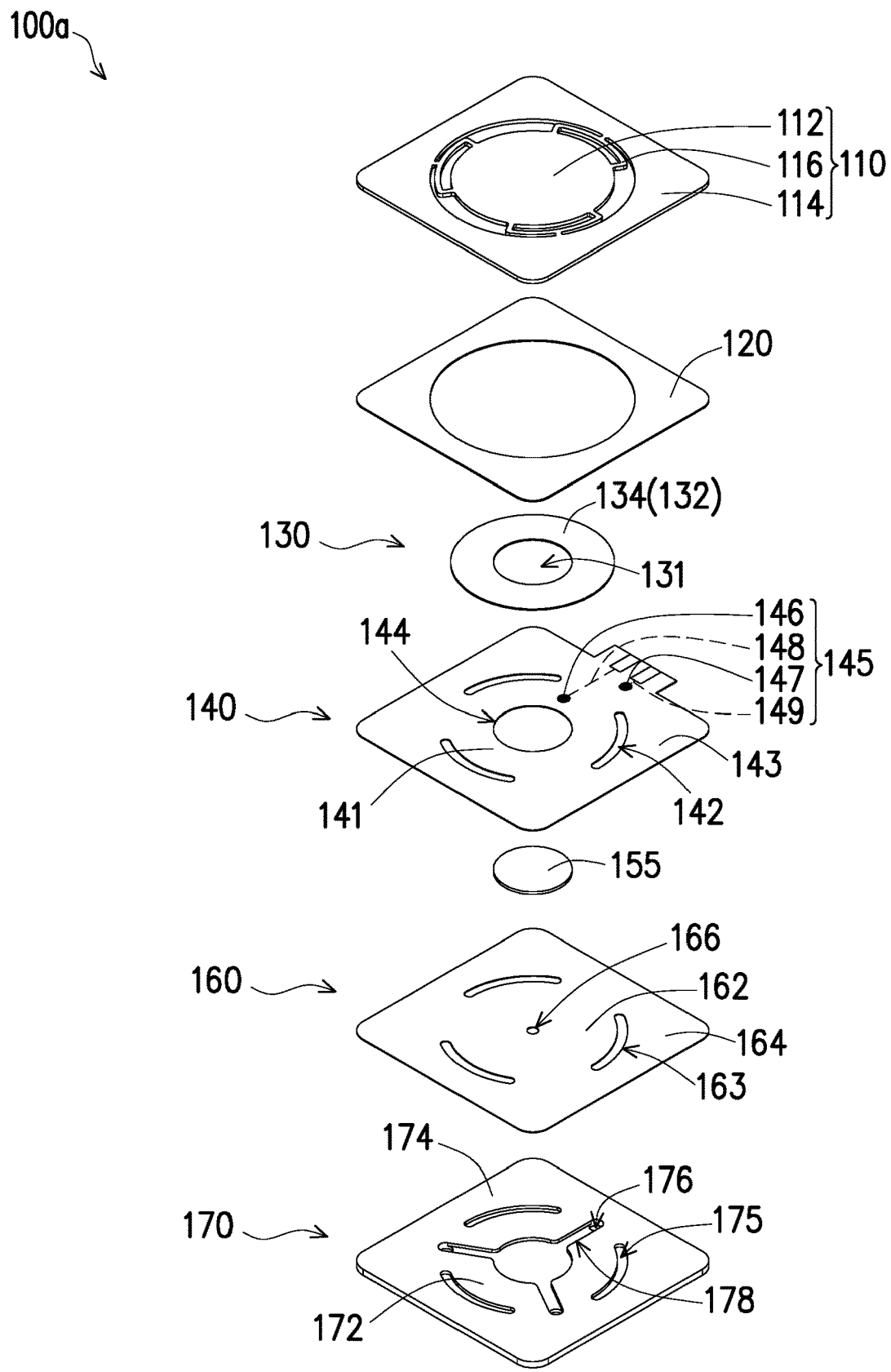
FIG. 6 is a schematic exploded view of a fluid driving system according to a second embodiment of the disclosure.
Figure 7:
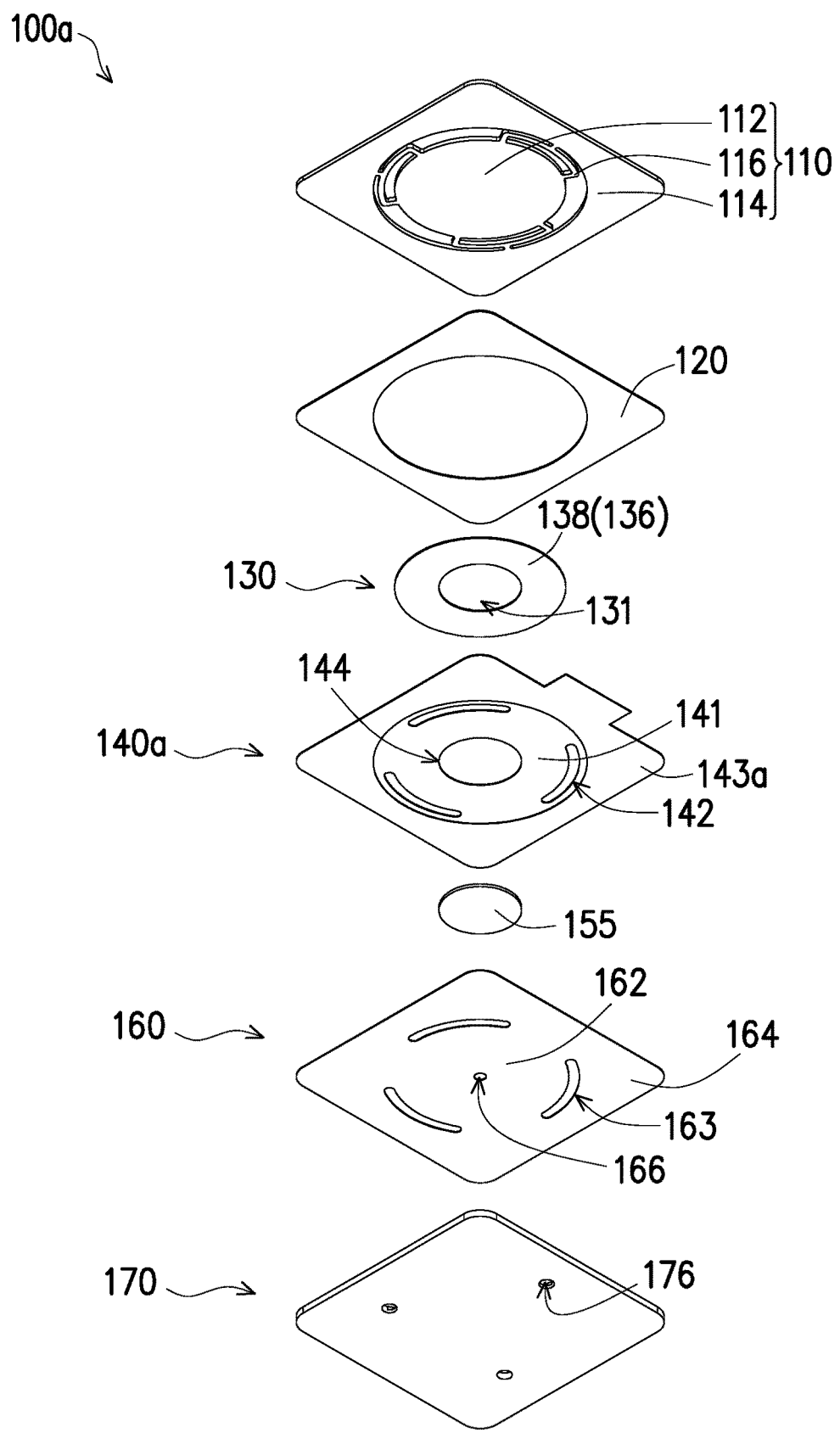
FIG. 7 is a schematic view illustrating the fluid driving system in FIG. 6 at another view angle.
Figure 8:
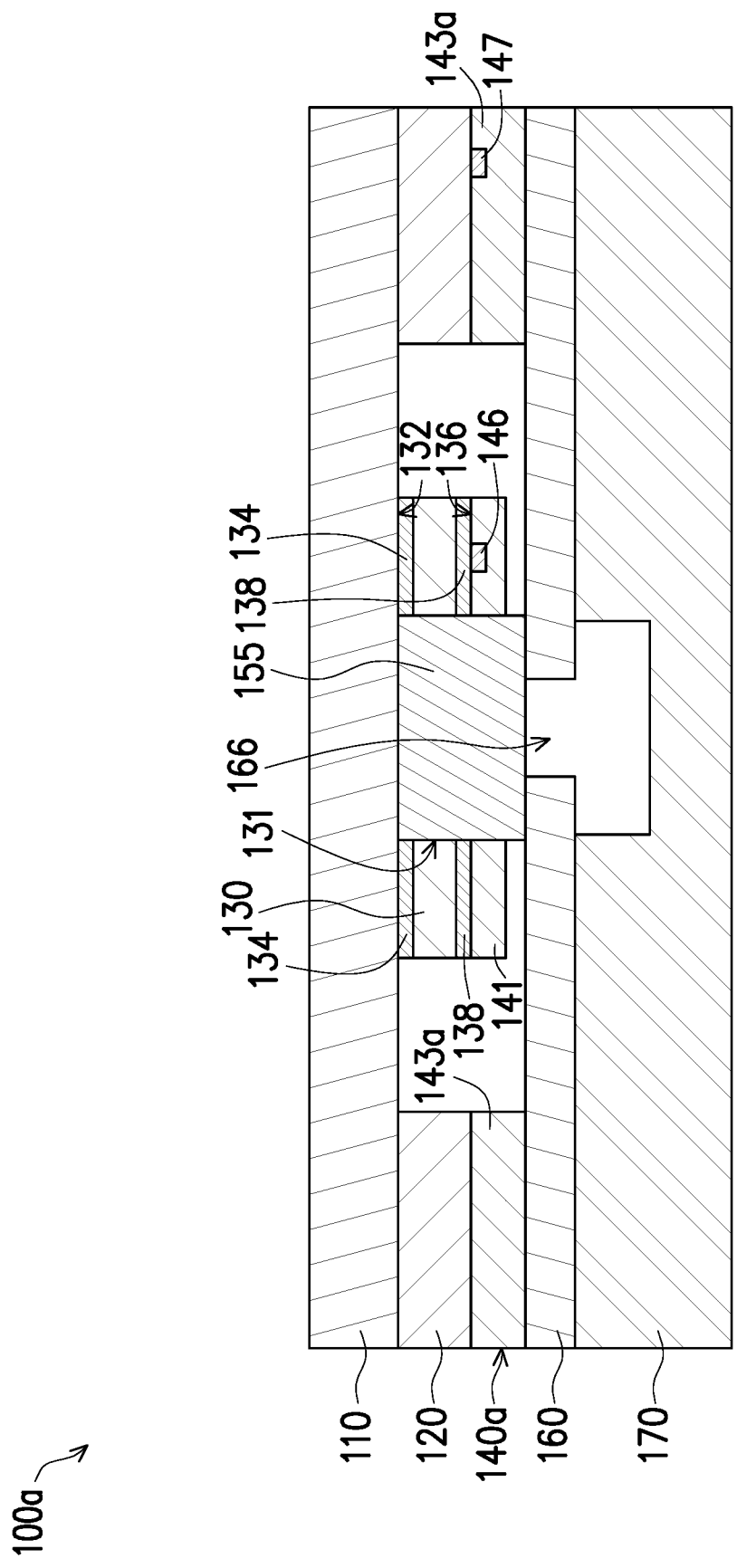
FIG. 8 is a schematic cross-sectional view illustrating the fluid driving system depicted in FIG. 6.

FIG. 6 is a schematic exploded view of a fluid driving system according to a second embodiment of the disclosure. FIG. 7 is a schematic view illustrating the fluid driving system in FIG. 6 at another view angle. FIG. 8 is a schematic cross-sectional view illustrating the fluid driving system depicted in FIG. 6. With reference to FIG. 6 to FIG. 8, the main difference between the fluid driving system 100a provided in the embodiment and the fluid driving system 100 provided in the previous embodiment lies in that the thickness of the transmission unit 140 in the second central zone 141 is the same as the thickness of the transmission unit 140 in the second peripheral zone 143 according to the previous embodiment as shown in FIG. 5A, and the support member 150 is disposed between the second peripheral zone 143 of the transmission unit 140a and the plane unit 160.

In the present embodiment as shown in FIG. 8, the transmission unit 140a has different thicknesses; particularly, the thickness of the second central zone 141 of the transmission unit 140a is less than the thickness of the second peripheral zone 143a of the transmission unit 140a. According to the present embodiment, the transmission unit 140a can be considered as being integrally formed together with the second peripheral zone 143 of the transmission unit 140 and the support member 150 shown in FIG. 5A. Therefore, in the present embodiment, the lower surface of the protrusion 155 is aligned to the lower surface of the transmission unit 140a in the second peripheral zone 143a.

Figure 9:
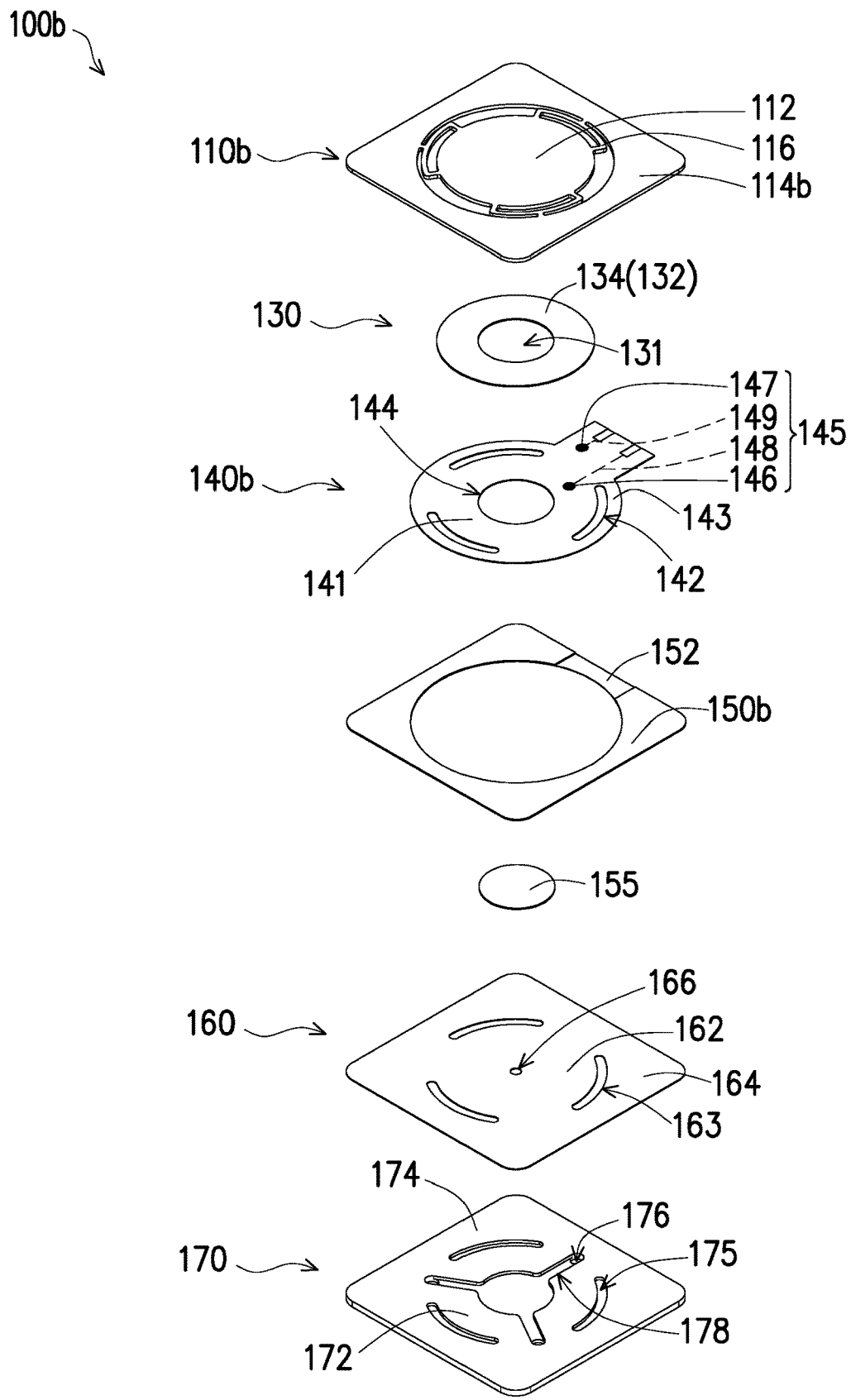
FIG. 9 is a schematic exploded view of a fluid driving system according to a third embodiment of the disclosure.
Figure 10:
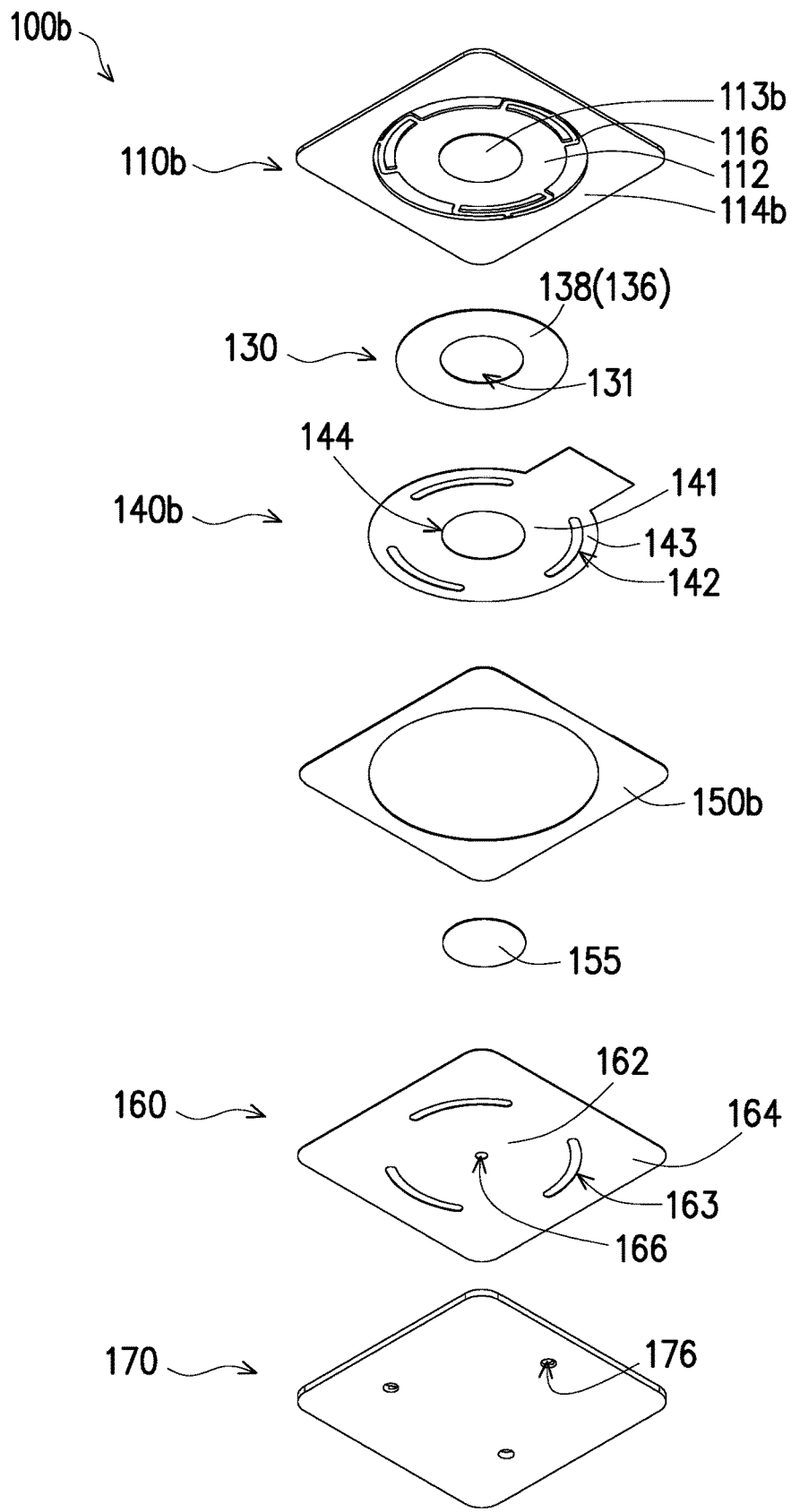
FIG. 10 is a schematic view illustrating the fluid driving system in FIG. 9 at another view angle.
Figure 11:
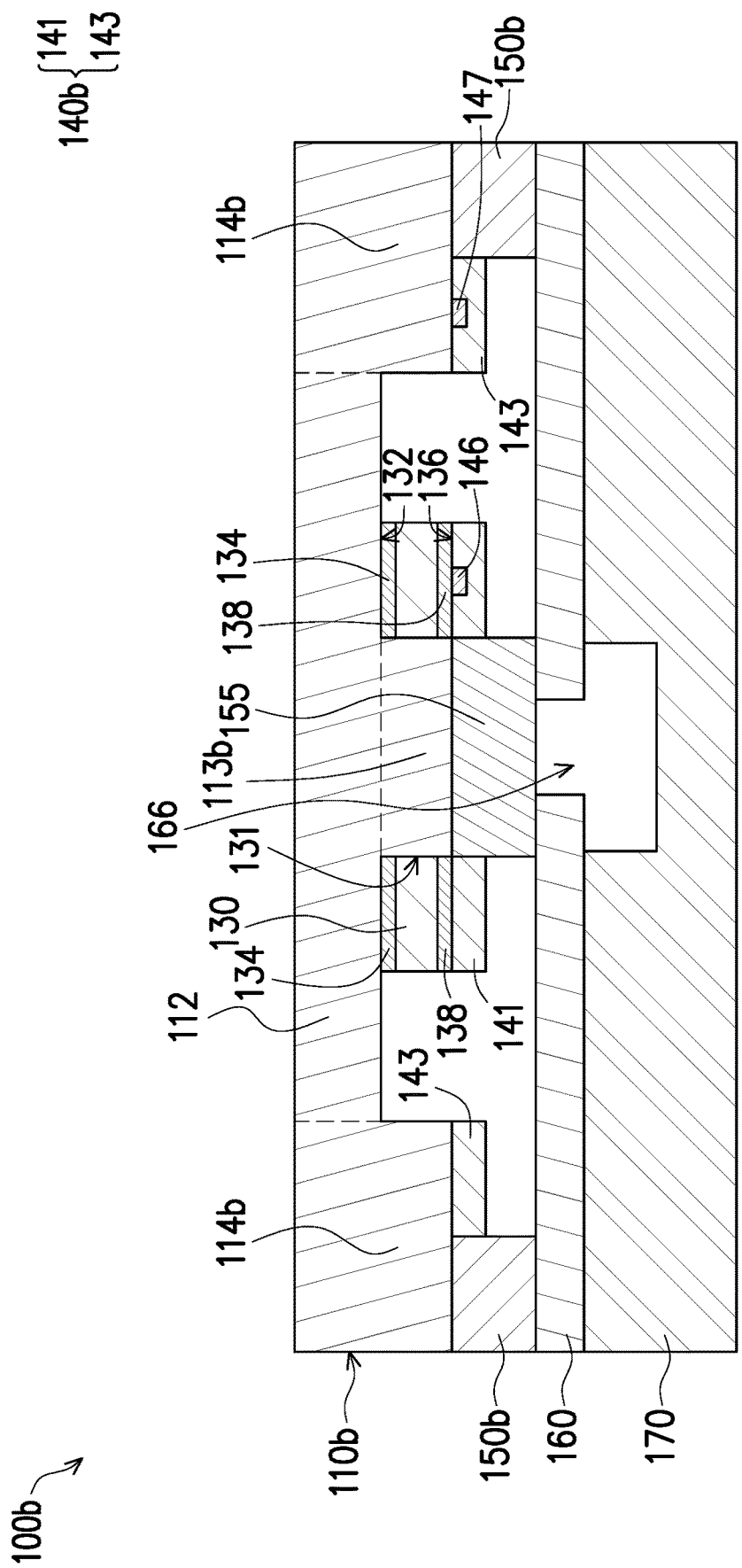
FIG. 11 is a schematic cross-sectional view illustrating the fluid driving system depicted in FIG. 9.

FIG. 9 is a schematic exploded view of a fluid driving system according to a third embodiment of the disclosure. FIG. 10 is a schematic view illustrating the fluid driving system in FIG. 9 at another view angle. FIG. 11 is a schematic cross-sectional view illustrating the fluid driving system depicted in FIG. 9. With reference to FIG. 9 to FIG. 11, the main difference between the fluid driving system 100b provided in the present embodiment and the fluid driving system 100 provided in the embodiment shown in FIG. 5A lies in that the thickness of the first central zone 112 of the vibration unit 110 is the same as the thickness of the first peripheral zone 114 according to the embodiment depicted in FIG. 5A. Besides, in the embodiment shown in FIG. 5A, the distribution area of the support member 150 corresponds to the distribution area of the second peripheral zone 143 of the transmission unit 140. That is, in the embodiment shown in FIG. 5A, the support member 150 is stacked with the second peripheral zone 143 of the transmission unit 140.

As shown in FIG. 10, in the present embodiment, there is a boss 113b on a surface (lower surface) of the vibration unit 110b located at the first central zone 112 and facing the piezoelectric element 130. In addition, with reference to FIG. 11, the lower surface of the first peripheral zone 114b of the vibration unit 110b is aligned to the lower surface of the boss 113b. According to the present embodiment, the boss 113b passes through the through hole 131 of the piezoelectric element 130, and the lower surface of the piezoelectric element 130 is aligned to the lower surface of the boss 113b.

Besides, as shown in FIG. 11, in the present embodiment, an outer contour of the second peripheral zone 143 of the transmission unit 140b is smaller than the inner contour of the support member 150b, such that the transmission unit 140b can be located in the support member 150b, and that the transmission unit 140b and the support member 150b in most of the zones are not overlapped. The support member 150b is in direct contact with the first peripheral zone 114b of the vibration unit 110b. In the present embodiment, the protrusion 155 is disposed at the boss 113b, and the lower surface of the protrusion 155 is aligned to the lower surface of the support member 150b. In the present embodiment as shown in FIG. 6, the thickness of the protrusion 155 is substantially the same as the thickness of the support member 150b. Therefore, the protrusion 155 and the support member 150b can be made of the same object, such that the protrusion 155 and the support member 150b are characterized by high precision.

As shown in FIG. 9, in the present embodiment, note that the support member 150b has a concave portion 152 for holding one portion of the transmission unit 140b, and the thickness of the support member 150b at the concave portion 152 is smaller than the thickness of other portions of the support member 150b. Accordingly, the thickness reduced at the concave portion 152 is substantially the same as the thickness of the transmission unit 140b. Certainly, in other embodiments, the concave portion 152 of the support member 150b may be hollow, that is the concave portion 152 does not exist, so that one portion of the transmission unit 140b can pass through the hollow zone; however, the type of the support member 150b is not limited thereto.

Figure 12:
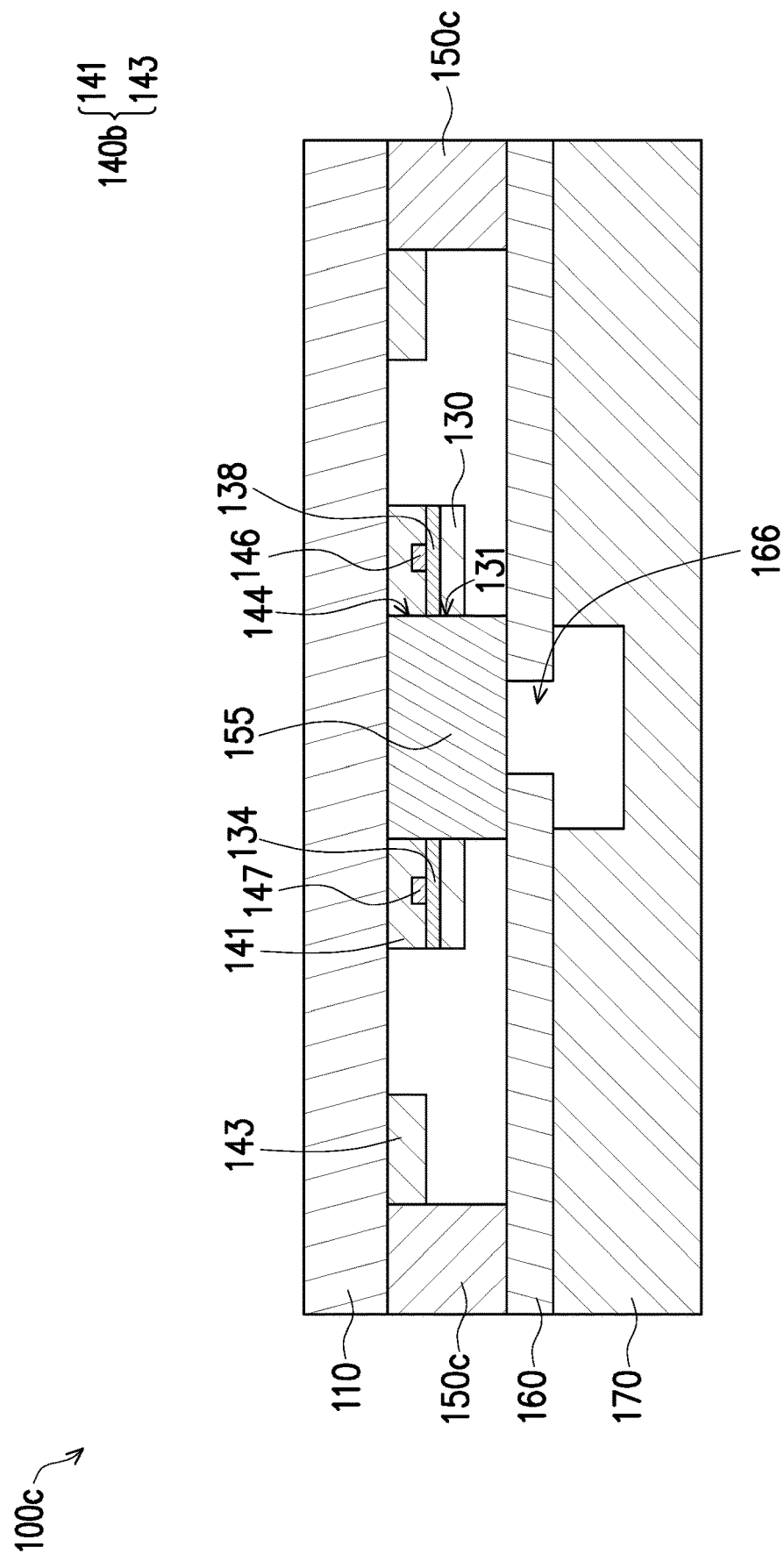
FIG. 12 is a schematic cross-sectional view of a fluid driving system according to a fourth embodiment of the disclosure.

FIG. 12 is a schematic cross-sectional view of a fluid driving system according to a fourth embodiment of the disclosure. With reference to FIG. 12, the main difference between the fluid driving system 100c provided in the present embodiment and the fluid driving system 100b provided in the embodiment shown in FIG. 11 lies in that the vibration unit 110b in the fluid driving system 100b as shown in FIG. 11 has plural thicknesses. Besides, in the central location of the fluid driving system 100b shown in FIG. 11, the vibration unit 110b, the piezoelectric element 130, the transmission unit 140b having the signal transmission layer, and the plane unit 160 are sequentially stacked together.

In the fluid driving system 100c provided in the present embodiment, the vibration unit 110 has one single thickness. In the central location of the fluid driving system 100c shown in FIG. 12, the transmission unit 140b is located between the vibration unit 110 and the piezoelectric element 130. That is, in the fluid driving system 100c of the present embodiment, the vibration unit 110, the transmission unit 140b having the signal transmission layer, the piezoelectric element 130, and the plane unit 160 are sequentially stacked together.

Additionally, in the present embodiment, the first electrode 134 and the second electrode 138 of the piezoelectric element 130 are located on the surface facing the transmission unit 140b (the upper surface of the piezoelectric element 130), and the first electrode 134 and the second electrode 138 are electrically isolated from each other. The transmission unit 140b includes the first conductive zone 147 and the second conductive zone 146 that are located on the lower surface and electrically insulated from each other, and the first conductive zone 147 and the second conductive zone 146 of the transmission unit 140b respectively correspond to the first electrode 134 and the second electrode 138 of the piezoelectric element 130, so that the piezoelectric element 130 is electrically connected to the transmission unit 140.

According to the present embodiment, the piezoelectric element 130 is in direct contact with and electrically connected to the transmission unit 140, and the piezoelectric element 130 is not electrically connected to the transmission unit 140 through the vibration unit 110. Hence, the material of the vibration unit 110 may not be metal, e.g., the vibration unit 110 may be made of ceramics or plastic, which should however not be construed as a limitation in the disclosure.

In the present embodiment, the thickness of the protrusion 155 is substantially the same as the thickness of the support member 150c. Therefore, the protrusion 155 and the support member 150c can be made of the same object, such that the protrusion 155 and the support member 150c are characterized by high precision.

Figure 13:
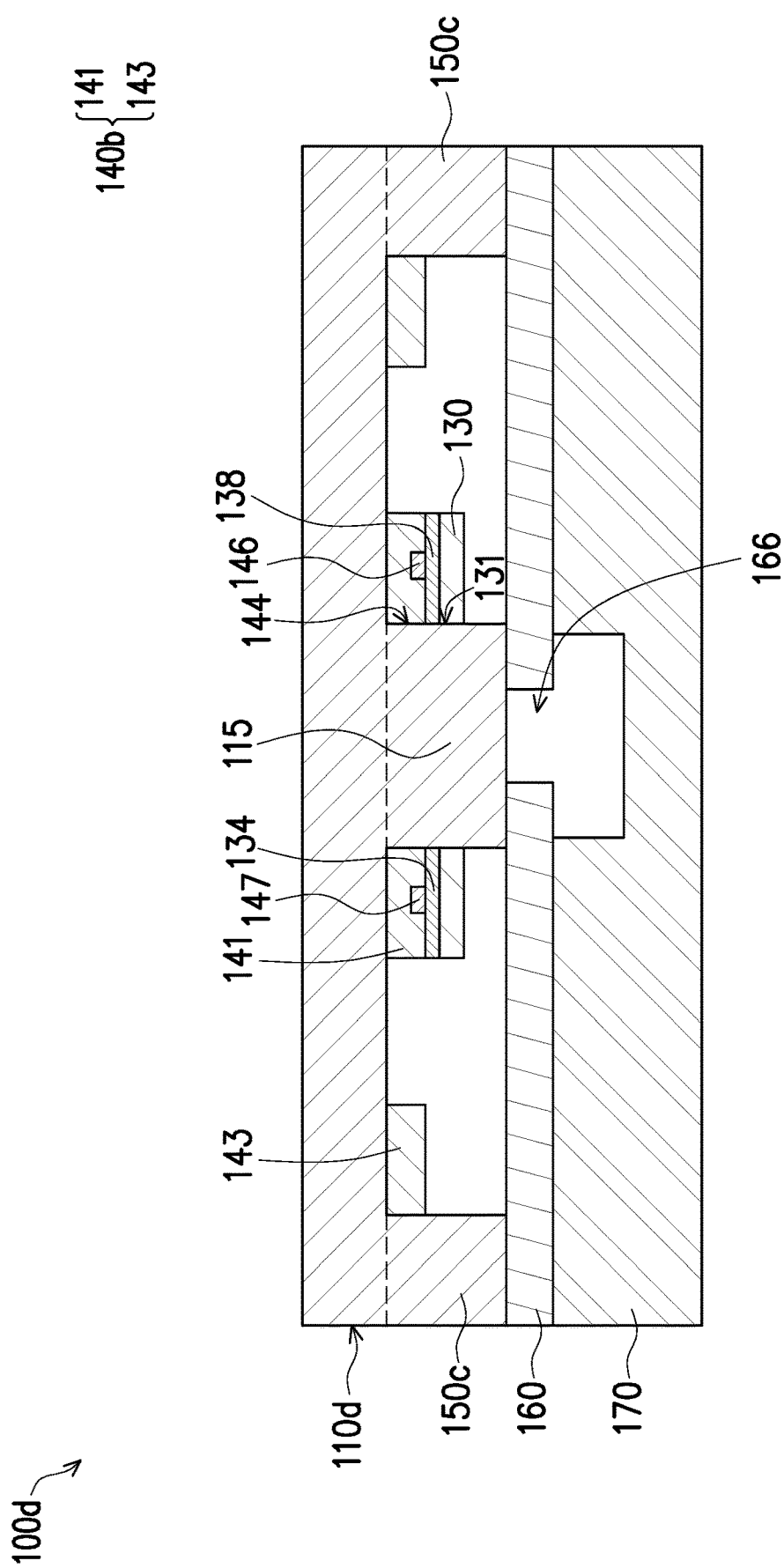
FIG. 13 is a schematic cross-sectional view of a fluid driving system according to a fifth embodiment of the disclosure.

FIG. 13 is a schematic cross-sectional view of a fluid driving system according to a fourth embodiment of the disclosure. With reference to FIG. 13, the main difference between the fluid driving system 100d provided in the present embodiment and the fluid driving system 100c depicted in FIG. 12 lies in that the vibration unit 110d in the present embodiment can be considered as an integral structure including the vibration unit 110, the protrusion 155, and the support member 150c depicted in FIG. 12. As such, the boss 115 of the vibration unit 110d corresponding to the hole 166 and the support member 150c can be integrally formed and have high precision. The number of the movable components at the central location of the fluid driving system 100d can be further reduced (i.e., only the vibration unit 110d), which ensures that the fluid driving system 100d has a relatively small tolerance and good precision.

To sum up, the piezoelectric element, the signal transmission layer, and the plane unit of the fluid driving system provided in the disclosure are respectively located on the same side of the vibration unit. The signal transmission layer configured to be electrically connected to the first electrode and the second electrode of the piezoelectric element is formed between the vibration unit and the plane unit; that is, the signal transmission layer is formed inside the fluid driving system and can be better protected. Besides, generally speaking, the central zone of the fluid driving system (i.e., a location of each layer corresponding to the hole of the plane unit which may be the valve plate) can be said to be the primary functional zone of the fluid driving system. In the fluid driving system provided in one or more embodiments of the disclosure, the protrusion is arranged between the vibration unit and the plane unit, and the protrusion corresponds to and protrudes toward the hole. As such, the components at the central location of the fluid driving system provided herein can only be the vibration unit, the protrusion, and the plane unit. That is, the number of components at the central location of the fluid driving system is small, which ensures that the fluid driving system has a relatively small tolerance and good precision.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A fluid driving system comprising:
   a vibration unit;
   a piezoelectric element comprising a first electrode and a second electrode electrically isolated from each other;
   a signal transmission layer comprising a first conductive zone and a second conductive zone, the first electrode of the piezoelectric element being electrically connected to the first conductive zone of the signal transmission layer, the second electrode of the piezoelectric element being electrically connected to the second conductive zone of the signal transmission layer;
   a plane unit having at least one hole, wherein the piezoelectric element, the signal transmission layer, and the plane unit are located at one side of the vibration unit; and
   a protrusion located between the vibration unit and the plane unit, the protrusion corresponding to and protruding toward the at least one hole; wherein the piezoelectric element comprises a through hole, and the protrusion passes through the through hole and is fixed to the vibration unit.

2. The fluid driving system of claim 1, wherein the vibration unit comprises a first central zone, a first peripheral zone, and a plurality of first connection zones connected to the first central zone and the first peripheral zone, and a surface of the first peripheral zone facing the plane unit is coplanar with a surface of the piezoelectric element facing the plane unit.

3. The fluid driving system of claim 1, wherein the protrusion is surrounded by the piezoelectric element.

4. The fluid driving system of claim 1, wherein the vibration unit and the protrusion are integrally formed.

5. The fluid driving system of claim 1, wherein the vibration unit, the piezoelectric element, the signal transmission layer, and the plane unit are sequentially stacked.

6. The fluid driving system of claim 5, wherein the piezoelectric element has a first surface and a second surface opposite to each other, the first electrode and the second electrode are respectively located on the first surface and the second surface, the first surface of the piezoelectric element faces the vibration unit, the vibration unit is a conductor, and the first electrode of the piezoelectric element is electrically connected to the first conductive zone of the signal transmission layer through the vibration unit.

7. The fluid driving system of claim 1, further comprising:
   a frame, the vibration unit comprising a first central zone, a first peripheral zone, and a plurality of first connection zones connected to the first central zone and the first peripheral zone, the protrusion and the piezoelectric element being fixed to the first central zone of the vibration unit, the frame being fixed to the first peripheral zone of the vibration unit.

8. The fluid driving system of claim 6, wherein a surface of the frame facing the plane unit is coplanar with a surface of the piezoelectric element facing the plane unit.

9. The fluid driving system of claim 1, further comprising:
   a transmission unit located between the piezoelectric element and the plane unit and comprising a second central zone corresponding to the piezoelectric element and a second peripheral zone located outside the second central zone, the first conductive zone being formed in the second peripheral zone of the transmission unit, the second conductive zone being formed on the second central zone of the transmission unit.

10. The fluid driving system of claim 9, wherein the transmission unit is a flexible printed circuit board.

11. The fluid driving system of claim 1, further comprising:
    a transmission unit, the first conductive zone and the second conductive zone being formed on the transmission unit, the transmission unit being located between the vibration unit and the piezoelectric element, the piezoelectric element comprising a first surface facing the transmission unit, the first electrode and the second electrode being located on the first surface of the piezoelectric element.

12. The fluid driving system of claim 11, wherein the transmission unit is a flexible printed circuit board.

13. The fluid driving system of claim 1, further comprising:
    a support member disposed between a first peripheral zone of the vibration unit and the plane unit, a surface of the support member facing the plane unit being coplanar with a surface of the protrusion facing the plane unit.

14. The fluid driving system of claim 13, further comprising:
    a transmission unit located between the piezoelectric element and the plane unit, the support member being arranged between the transmission unit and the plane unit.

15. The fluid driving system of claim 14, wherein the support member and the transmission unit are integrally formed.

16. The fluid driving system of claim 14, wherein the transmission unit is a flexible printed circuit board.

* * * * *